US009385346B2

(12) United States Patent
Lin et al.

(10) Patent No.: US 9,385,346 B2
(45) Date of Patent: Jul. 5, 2016

(54) ORGANIC LIGHT EMITTING DIODE DISPLAY PANEL AND METHOD FOR MANUFACTURING THE SAME

(71) Applicant: InnoLux Corporation, Miao-Li County (TW)

(72) Inventors: Tun-Huang Lin, Miao-Li County (TW); Hao-Jung Huang, Miao-Li County (TW)

(73) Assignee: INNOLUX CORPORATION (TW)

( * ) Notice: Subject to any disclaimer, the term of this patent is extended or adjusted under 35 U.S.C. 154(b) by 0 days.

(21) Appl. No.: 14/522,748

(22) Filed: Oct. 24, 2014

(65) Prior Publication Data

US 2015/0144907 A1    May 28, 2015

(30) Foreign Application Priority Data

Nov. 28, 2013  (TW) .............................. 102143414 A

(51) Int. Cl.
*H01L 51/56* (2006.01)
*H01L 51/52* (2006.01)

(52) U.S. Cl.
CPC ............ *H01L 51/56* (2013.01); *H01L 51/5246* (2013.01); *H01L 2251/566* (2013.01)

(58) Field of Classification Search
CPC ................. H01L 2251/566; H01L 2251/5246; H01L 2251/524; H01L 2924/12044; H01L 23/15

See application file for complete search history.

(56) References Cited

U.S. PATENT DOCUMENTS

| 8,491,956 | B2 | 7/2013 | Kim | |
| 9,055,669 | B2* | 6/2015 | Wu | ............................. C09J 5/00 |
| 9,231,230 | B2* | 1/2016 | Roh | .................... H01L 51/5246 |
| 2007/0170861 | A1* | 7/2007 | Lee | ............................ C03C 8/24 |
| | | | | 313/512 |
| 2015/0194625 | A1* | 7/2015 | Kim | .................... H01L 27/3223 |
| | | | | 257/40 |

FOREIGN PATENT DOCUMENTS

TW           I405494 B       8/2013
TW        201343403 A       11/2013

OTHER PUBLICATIONS

Lee et al., English Machine Translated of TW Publication No. TWI405494, Aug. 11, 2013; (Machine Translated Nov. 5, 2015.*

* cited by examiner

*Primary Examiner* — Mohsen Ahmadi
(74) *Attorney, Agent, or Firm* — Bacon & Thomas, PLLC

(57) ABSTRACT

An organic light emitting diode display panel is disclosed, which comprises: a first substrate having a first edge, a second edge, a third edge opposite to the first edge, and a fourth edge opposite to the second edge; a second substrate opposite to the first substrate; an organic light emitting diode unit disposed on the second substrate; a fit unit disposed between the first substrate and the second substrate and surrounding the organic light emitting diode unit; and a buffer unit disposed between the first substrate and the second substrate and between the frit unit facing to the first edge of the first substrate and the first edge thereof, wherein the buffer unit has a first end with a first cutting edge connecting to the second edge. In addition, the present invention also provides a method for manufacturing the same.

4 Claims, 6 Drawing Sheets

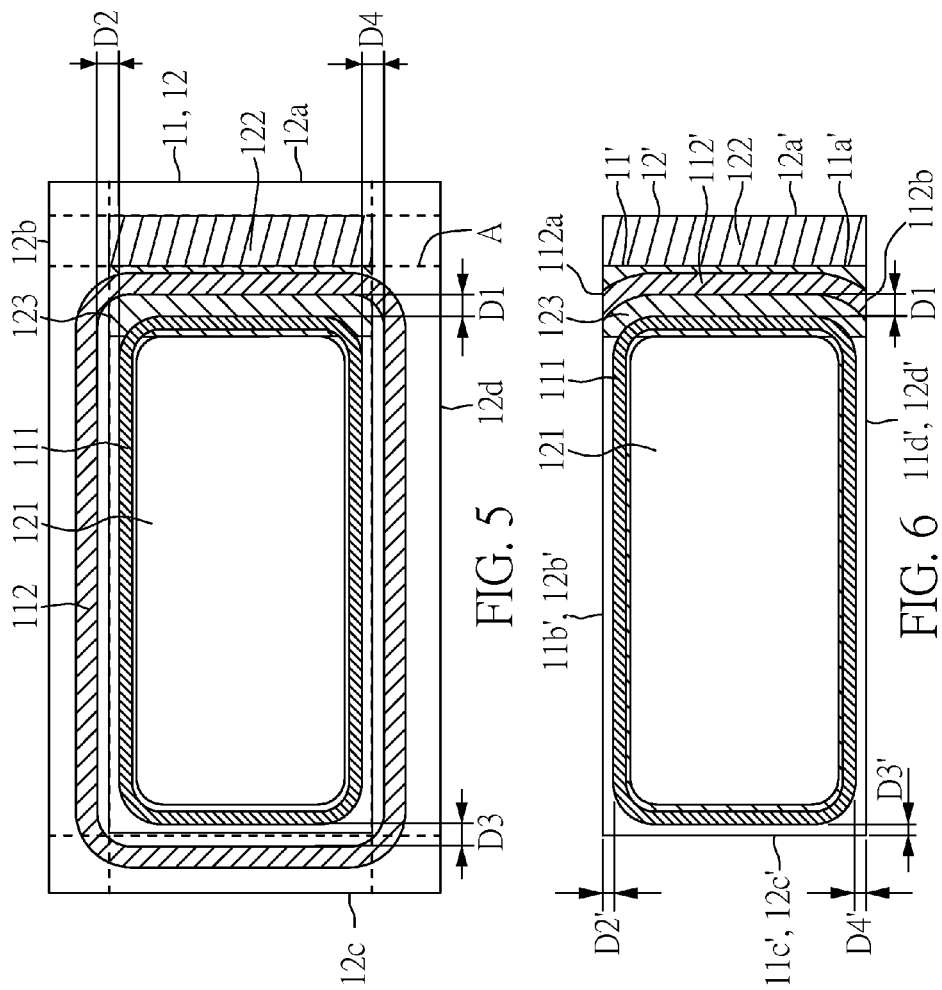

ORGANIC LIGHT EMITTING DIODE DISPLAY PANEL AND METHOD FOR MANUFACTURING THE SAME

CROSS REFERENCE TO RELATED APPLICATION

This application claims the benefits of the Taiwan Patent Application Serial Number 102143414, filed on Nov. 28, 2013, the subject matter of which is incorporated herein by reference.

BACKGROUND OF THE INVENTION

1. Field of the Invention

The present invention relates to an organic light emitting diode (OLED) display panel and a method for manufacturing the same and, more particularly, to an OLED display panel with a narrow border region and a method for manufacturing the same.

2. Description of Related Art

OLED display devices are light in weight and ultra-thin in thickness, and also have advantages of high brightness, rapid response, wide viewing angles, no backlight requirement, low manufacturing cost and flexibility. Hence, OLED display devices have great potential to apply on display panels of various electronic devices such as panels of smartphones, pads, notebooks, monitors and televisions. However, for the OLED display panel, one important factor causing the lifetime thereof reduced is the pollution and erosion by moisture. Hence, a fit frit is usually used to seal the panel, in order to produce a display device having good moisture barrier property and air impermeability.

In general, the OLED display devices are prepared with glass substrates and packages with frit units. Although the frit units have better mechanical strength than frame paste, they cannot absorb external impacts due to the low elasticity thereof. Therefore, residual stress remained in the substrate after a laser sintering process may cause the frit units cracked or broken.

More specifically, during the process for sintering the frit units with laser, the energy absorbed by the frit units is differed due to the scanning time of laser and the thermal conductivity of the frit units, which causes the sintering temperature distributed unevenly therein. In addition, when the melt frit units solidified and shrunk, the stress applied on the substrates may remain in the region corresponding to the sintering path and a heat affected zone close to the sintering path, and such stress is also called as a residual stress. If the two substrates are fixed tight, an extremely high stress may be generated. On the contrary, if the two substrates are not fixed, the substrates may be deformed. Both the residual stress and the deformed substrates may cause the substrates or the frit units cracked or broken, due to the impacts generated by the vibration of a scribing wheel during the cutting process.

In order to solve the aforementioned problems, it is desirable to provide an OLED display panel and a method for manufacturing the same, which can be applied on the currently used cutting machine, solve the problem of reduced yield rate caused by the stress generated during the cutting process, improve the yield rate of the display panels, and obtain the display panels with narrow border regions.

SUMMARY OF THE INVENTION

An object of the present invention is to provide an organic light emitting diode (OLED) display panel with a narrow border region.

Another object of the present invention is to provide a method for manufacturing an OLED display panel, in which the problem that the deformation of glass substrates or the cracks in frit units caused by stress generated during the sintering process of the frit unit can be prevented.

To achieve the object, the OLED display panel of the present invention comprises: a first substrate having a first edge, a second edge, a third edge opposite to the first edge, and a fourth edge opposite to the second edge; a second substrate opposite to the first substrate; an organic light emitting diode (OLED) unit disposed on the second substrate; a frit unit disposed between the first substrate and the second substrate and surrounding the OLED unit; and a buffer unit disposed between the first substrate and the second substrate and between the frit unit facing to the first edge of the first substrate and the first edge thereof, wherein the buffer unit has a first end with a first cutting edge connecting to the second edge of the first substrate, and a second end opposite to the first end.

In addition, the present invention further provides a method for manufacturing an OLED display panel, which comprises the following steps: providing a first mother substrate and a second mother substrate having a fifth edge, a sixth edge, a seventh edge opposite to the fifth edge and an eighth edge opposite to the sixth edge, wherein at least one OLED unit is disposed on the second mother substrate, at least one frit unit and at least one buffer unit are disposed between the first mother substrate and the second mother substrate, each of the frit unit respectively surrounds the OLED unit, and each of the buffer unit respectively surrounds the frit unit to obtain each of the OLED unit being sequentially enclosed with the frit unit and the buffer unit respectively; and cutting the first mother substrate and the second mother substrate at a side facing to the fifth edge of the second mother substrate and opposite to a side of the buffer unit near the fit unit, on the basis of the OLED unit.

In one aspect of the present invention, the method for manufacturing the OLED display panel of the present invention comprises the following steps: (A) providing a first mother substrate and a second mother substrate having a fifth edge, a sixth edge, a seventh edge opposite to the fifth edge and an eighth edge opposite to the sixth edge, wherein at least one frit unit and at least one buffer unit surrounding the frit unit are disposed on the first mother substrate, and at least one OLED unit is disposed on the second mother substrate; (B) assembling the first mother substrate and the second mother substrate to make each frit unit and the buffer unit surround the OLED unit; and (C) cutting the first mother substrate and the second mother substrate at a side facing to the fifth edge of the second mother substrate and opposite to a side of the buffer unit near the fit unit, on the basis of the OLED unit.

In another aspect of the present invention, the method for manufacturing the OLED display panel of the present invention comprises the following steps: (A) providing a first mother substrate and a second mother substrate having a fifth edge, a sixth edge, a seventh edge opposite to the fifth edge and an eighth edge opposite to the sixth edge, wherein at least one OLED unit, at least one frit unit and at least one buffer unit are disposed on the second mother substrate, each of the frit unit respectively surrounds the OLED unit, and each of the buffer unit respectively surrounds the frit unit, so that each of the OLED unit are sequentially enclosed with the frit unit and the buffer unit respectively; (B) assembling the first mother substrate and the second mother substrate; and (C) cutting the first mother substrate and the second mother substrate at a side facing to the fifth edge of the second mother substrate and opposite to a side of the buffer unit near the frit unit, on the basis of the OLED unit.

In the method for manufacturing the OLED display panel of the present invention, the disposition of the buffer unit can prevent the problem that the deformation of the glass substrates or the cracks in the frit units caused by stress generated during the sintering process of the frit unit. Meanwhile, during the process of cutting the first mother substrate and the second mother substrate, only the buffer unit at a side of the OLED unit facing to the fifth edge of the second mother substrate is reserved. Hence, in the obtained OLED display panel of the present invention, the formed buffer unit after the cutting process is only disposed at a side facing to the first edge of the second substrate; and therefore the purpose of narrow border regions can be achieved.

In the step (C) of the method for manufacturing the OLED display panel of the present invention, both the first mother substrate and the second mother substrate are cut at sides facing to the sixth edge, the seventh edge and the eighth edge of the second substrate and between the buffer unit and the frit unit, on the basis of the OLED unit respectively. Hence, in the obtained OLED display panel of the present invention, a second cutting edge of the second end of the buffer unit connects to the fourth edge of the first substrate.

In the step (A) of the method for manufacturing the OLED display panel of the present invention, at least one terminal unit is disposed on the second mother substrate, which corresponds to a side of the OLED unit facing to the fifth edge of the second mother substrate. Hence, the obtained OLED display panel of the present invention may further comprise a terminal unit disposed on the second substrate and corresponding to the first edge of the first substrate.

In addition, in the method for manufacturing the OLED display panel of the present invention, at a side of the OLED unit facing to the fifth edge of the second mother substrate, a distance between a buffer edge of the buffer unit and a frit edge of the frit unit facing to the buffer edge (i.e. a minimum distance between the buffer unit and the frit unit) may be in a range from 50 μm to 800 μm at a side corresponding to the fifth edge of the second mother substrate; and preferably is in a range from 100 μm to 300 μm. Hence, in the obtained OLED display panel of the present invention, a distance between a buffer edge of the buffer unit and a frit edge of the frit unit facing to the buffer edge (i.e. a minimum distance between the buffer unit and the frit unit) may be in a range from 50 μm to 800 μm; and is preferably in a range from 100 μm to 300 μm.

Furthermore, in the method for manufacturing the OLED display panel of the present invention, at the remaining sides of the OLED unit facing to the sixth edge, the seventh edge and the eighth edge of the second mother substrate, distances between a buffer edge of the buffer unit and a frit edge of the frit unit facing to the buffer edge (i.e. a minimum distance between the buffer unit and the frit unit) may be respectively in a range from 300 μm to 1500 μm at side corresponding to the sixth edges, the seventh edge and the eighth edge of the second mother substrate; and are preferably in a range from 500 μm to 1000 μm respectively. In an ideal case, a cutting line is located in the middle of the buffer edge of the buffer unit and the frit edge of the frit unit, at sides facing to the sixth edge, the seventh edge and the eighth edge of the second mother substrate. Hence, in the obtained OLED display panel of the present invention, distances between the frit edge of the frit unit and the second edge, the third edge and the fourth edge of the second substrate may respectively be 150 μm to 750 μm; and are preferably in a range from 250 μm to 500 μm respectively.

In the OLED display panel and the method for manufacturing the same of the present invention, a width of the buffer unit before or after the cutting process may be in a range from 250 μm to 1200 μm. In addition, a width of the frit unit may be in a range from 500 μm to 1000 μm.

In addition, the present invention further provides an OLED display device with the aforementioned OLED display panel.

Other objects, advantages, and novel features of the invention will become more apparent from the following detailed description when taken in conjunction with the accompanying drawings.

BRIEF DESCRIPTION OF THE DRAWINGS

FIG. 5 is a perspective view showing cutting lines on a first mother substrate and a second mother substrate according to one preferred embodiment of the present invention;

FIG. 6 is a perspective view of an OLED display panel according to one preferred embodiment of the present invention;

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Figure 1:
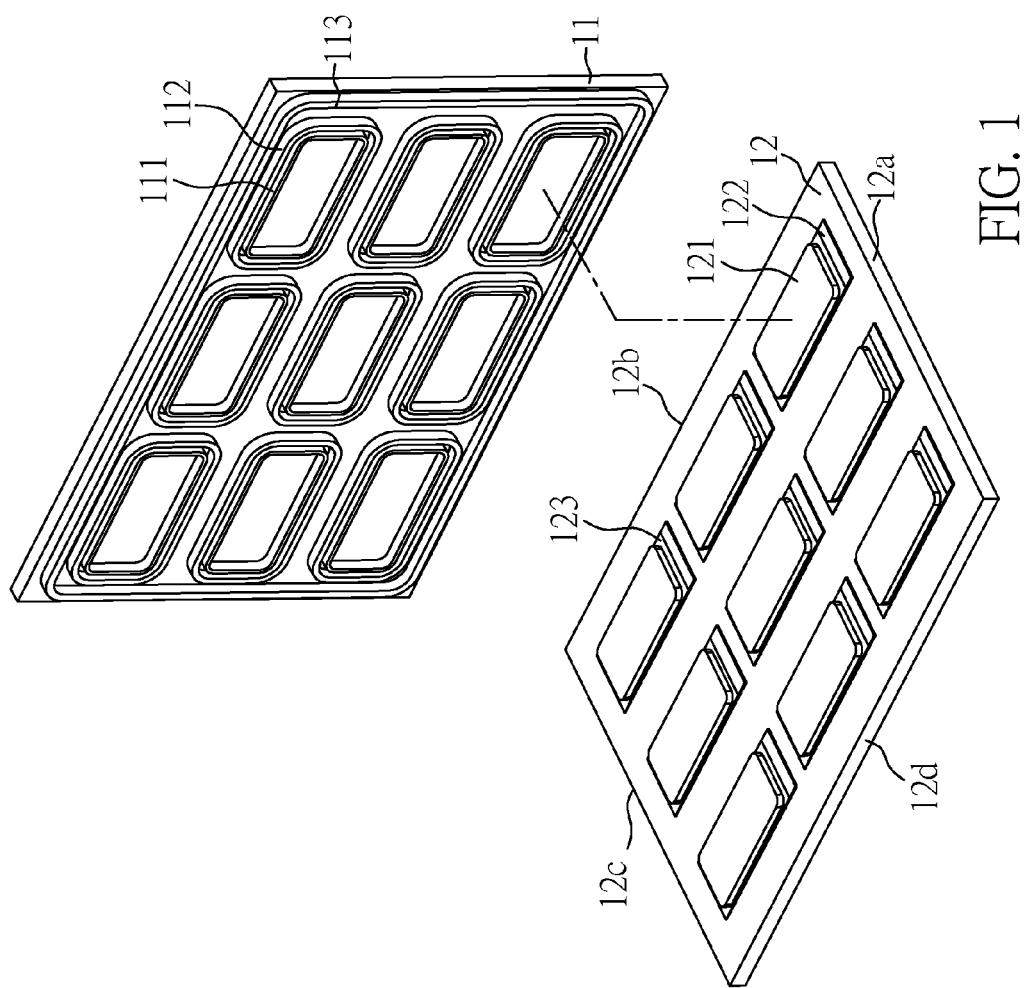
FIG. 1 is a perspective view showing a first mother substrate and a second mother substrate before an assembling process according to one preferred embodiment of the present invention.

FIG. 1 is a perspective view showing a first mother substrate and a second mother substrate before an assembling process according to one preferred embodiment of the present invention. First, a first mother substrate 11 and a second mother substrate 12 are provided, and both of which are glass substrates. For the first mother substrate 11, at least one frit unit 111 with a width of about 500 μm to 1000 μm is firstly applied on the first mother substrate 11, and then the applied frit unit 111 is glazed at about 500° C. to fix on the first mother substrate 11. Next, at least one buffer unit 112 is applied on the first mother substrate 11, which respectively surround each of the frit units 111 and is apart from each of the peripheries thereof about 250 μm to 1200 μm (preferably, 600 μm to 1200 μm); and then a frame paste 113 is applied along edges of the first mother substrate 11. In the present embodiment, the buffer unit 112 and the frame paste 113 can be formed with any adhesive glue generally used in the art. Preferably, the buffer unit 112 is formed with a silicone-based thermal curing paste or an epoxy-based UV curing paste; and the frame paste 113 is formed with any UV paste generally used in the art.

After the aforementioned process, the frit unit 111 and the buffer unit 112 are formed on the first mother substrate 11, and each of the buffer units 112 respectively surrounds one frit unit 111. Herein, plural frit units 111 and plural buffer units 112 are arranged in an array on the first mother substrate 11. In addition, in the present embodiment, the frame paste 113 is further disposed along the edges of the first mother substrate 11, so that all the frit units 111 and the buffer units 112 are located in a region formed by the frame paste 113.

For the second mother substrate 12, at least one OLED unit 121 is formed thereon. Herein, plural OLED units 121 are arranged in an array on the second mother substrate 12. The second mother substrate 12 has a fifth edge 12a, a sixth edge 12b, a seventh edge 12c opposite to the fifth edge 12a, and an eighth edge 12d opposite to the sixth edge 12b. In addition, in the present embodiment, as shown in FIG. 1 and FIG. 3, at least one terminal unit 122 and at least one lead region 123 are further disposed on the second mother substrate 12, which are arranged to correspond to a side of the OLED unit 121 facing to the fifth edge 12a of the second mother substrate 12.

Herein, the OLED unit 121 can have any organic light emitting diode (OLED) structure known in the art, for example, the OLED structure comprising two electrodes and an organic light emitting layer disposed therebetween. In addition, such OLED structure may further comprise layers for facilitating light emitting such as a hole injection layer, a hole transporting layer, an electron injection layer and/or an electron transporting layer. Herein, the detail structures thereof are not described.

Figure 2:
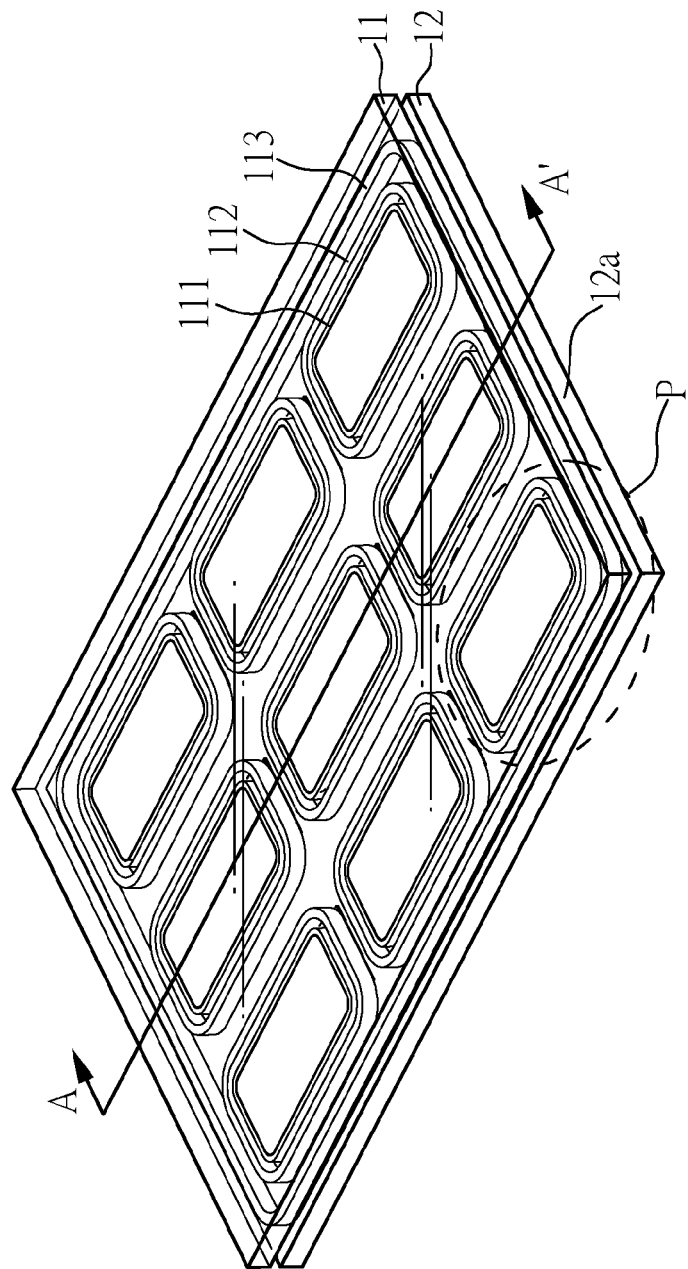
FIG. 2 is a perspective view showing a first mother substrate and a second mother substrate after an assembling process according to one preferred embodiment of the present invention.
Figure 3:
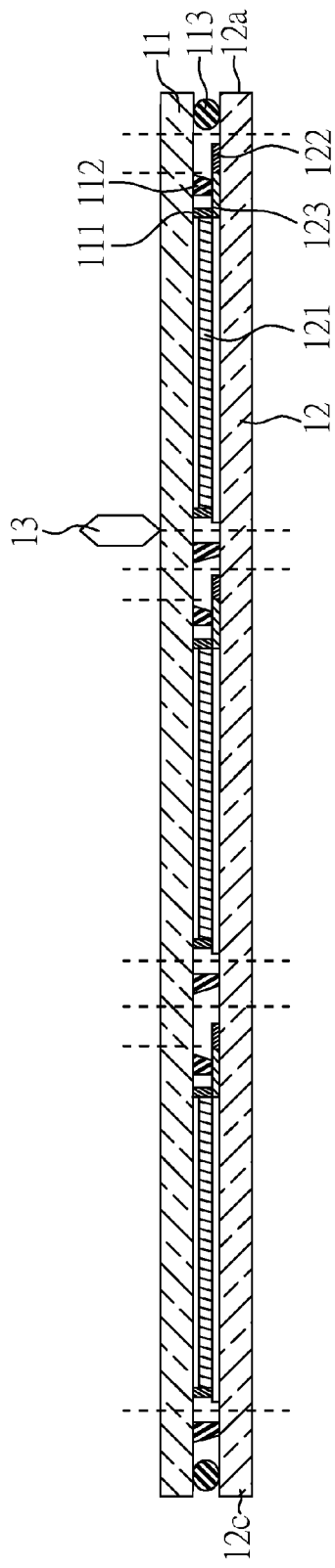
FIG. 3 is a cross-sectional view showing a first mother substrate and a second mother substrate after an assembling process according to one preferred embodiment of the present invention.

FIG. 2 is a perspective view showing a first mother substrate and a second mother substrate after an assembling process according to one preferred embodiment of the present invention; and FIG. 3 is a cross-sectional view showing a first mother substrate and a second mother substrate after an assembling process along a cross-sectional line A-A' of FIG. 2. After the first mother substrate 11 assembles with the second mother substrate 12, each frit unit 111 and each buffer unit 112 correspond and surround one OLED unit 121, as shown in FIG. 2 and FIG. 3. In particular, as shown in FIG. 3, the buffer unit 112 is located on the lead region 123 connecting to the OLED unit 121 and the terminal unit 122, at a side facing to the fifth edge 12a of the second mother substrate 12.

After the first mother substrate 11 assembles with the second mother substrate 12, an UV irradiation is performed on the frame paste 113 to fix it. Herein, when the buffer units 112 are formed with a thermal curing paste, an UV irradiation can be directly performed on the first mother substrate 11 and the second mother substrate 12 after the assembling process to cure the frame paste 113. When the buffer units 112 are formed with an UV curing paste, as shown in FIG. 4, a mask 2 has to be used to shield the buffer units 112 (i.e. shield the region outside the frame paste 113), and then an UV irradiation is performed on the first mother substrate 11 and the second mother substrate 12 to cure the frame paste 113.

After the frame paste 113 is cured, the frit units 111 are melt with laser to fix those on the second mother substrate 12. During the laser process formed on the frit units 111, the energy absorbed by the frit units 111 is differed due to the scanning time of laser and the thermal conductivity of the frit units 111, which causes the sintering temperature distributed unevenly therein, resulting in the structure and the crystal phase of the fit units 111 changed during the sintering process. In addition, the temperature of a region of the substrate (including the first mother substrate 11 and the second mother substrate 12) corresponding to the sintering path and a heat affected zone close to the sintering path is much higher than other region beyond the sintering path of the substrate, resulting in the deformation of the substrates when the melt frit units 111 solidified and shrunk. When the substrates are fixed together, the stress applied on the substrates may remain in the region corresponding to the sintering path and a heat affected zone close to the sintering path, and such stress is also called as a residual stress. However, in the present embodiment, the disposed buffer units 112 can be used as a medium to release the deformation of the substrates and the residual stress during the sintering process, to accomplish the purpose of preventing substrate deformation and reducing the residual stress.

Figure 4:
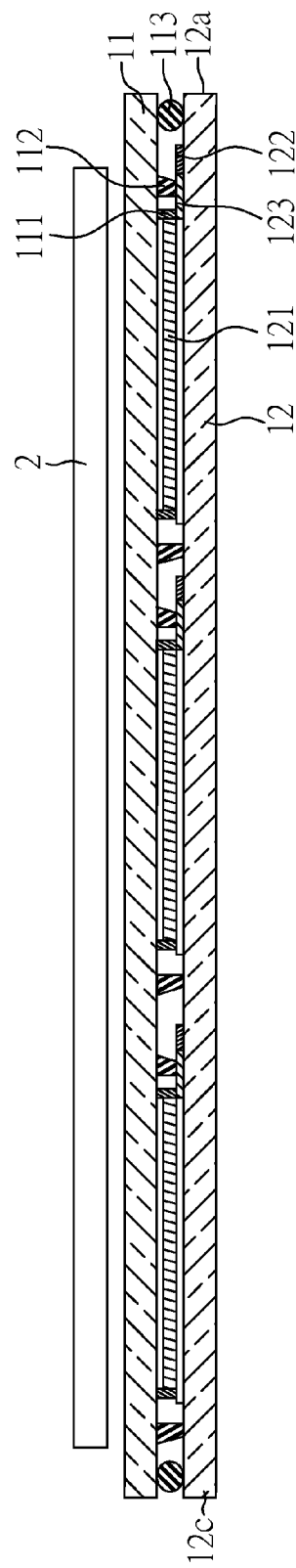
FIG. 4 is a perspective view showing a process for curing a frame paste.

As shown in FIG. 3 or FIG. 4, after the fit units 111 are sintered, a curing process is performed on the buffer units 112. When the buffer units 112 are formed with a thermal curing paste, the substrate can be heated to a predetermined temperature (such as 100° C.) to cure the buffer units 112. When the buffer units 112 are formed with an UV curing paste, an UV irradiation is performed thereon to cure the buffer units 112.

After the buffer units 112 are cured, a cutting process is performed on the substrates as shown in FIG. 3 and FIG. 5. For illustrated convenience, only one of the panel units P in FIG. 2 is shown in FIG. 5. As shown in FIG. 3 and FIG. 5, a scribing wheel 13 cuts the first mother substrate 11 and the second mother substrate 12 along the cutting lines (shown in dot lines in the figures). In FIG. 5, the scribing wheel 13 cuts both the first mother substrate 11 and the second mother substrate 12 along all the cutting lines, except that it cuts only the first mother substrate 11 along the cutting line A. Herein, on the basis of the OLED unit 121, the first mother substrate 11 and the second mother substrate 12 are cut at a side of the OLED unit 121 facing to the fifth edge 12a of the second mother substrate 12 and opposite to a side of the buffer unit 112 near the frit unit 111. In addition, the first mother substrate 11 and the second mother substrate 12 are cut at the other sides of the OLED unit 121 facing to the sixth edge 12b, the seventh edge 12c and the eighth edge 12d of the second substrate 12 and between the buffer unit 112 and the frit unit 111.

More specifically, as shown in FIG. 3 and FIG. 5, at a side of the OLED unit 121 facing to the fifth edge 12a of the second mother substrate 12, the first mother substrate 11 and the second mother substrate 12 are cut at the outside of the buffer unit 112. In detail, the cutting line for the second mother substrate 12 is located beyond the terminal unit 122, and the cutting line for the first mother substrate 11 is located on the terminal unit 122 to expose the terminal unit 122 after the cutting process. A distance D1 between the buffer edge of the buffer unit 112 and the frit edge of the frit unit 111 facing to the buffer edge (i.e. the minimum distance between the buffer unit 112 and the frit unit 111) is in a range from 50 μm to 800 μm, and preferably in a range from 100 μm to 300 μm. In addition, at the other sides of the OLED unit 121 facing to the sixth edge 12b, the seventh edge 12c and the eighth edge 12d of the second mother substrate 12, the first mother substrate 11 and the second mother substrate 12 are cut along the cutting paths between the buffer unit 112 and the frit unit 111 (i.e. the gap between the buffer unit 112 and the frit unit 111). In detail, the first mother substrate 11 and the second mother substrate 12 are preferably cut along the approximate middle of the cutting paths formed between the buffer unit 112 and the frit unit 111. Distances D2, D3, D4 between the buffer edge of the buffer unit 112 and the frit edge of the frit unit 111 facing to the buffer edge (i.e. the minimum distance between the buffer unit 112 and the frit unit 111) are respectively in a range from 300 μm to 1500 μm, and preferably in a range from 500 μm to 1000 μm.

In addition, the disposed buffer unit 112 can absorb the impact resulting from the vibration of the scribing wheel, to protect the frit units 111 and the substrates (including the first mother substrate 11 and the second mother substrate 12) against the impact during the cutting process. Hence, the generation of the cracks or the breaks of the frit units 111 and the substrates caused by the impact during the cutting process can be prevented to improve the yield rate of the display panels. Meanwhile, most of the buffer unit 112 except that on the lead region (i.e. the terminal region 122) is removed and not remained on the obtained OLED display panel, so that the purpose of obtaining OLED display panels with narrow border region can also be achieved.

After the aforementioned process followed by a packaging process, an OLED display panel of the present embodiment is obtained. As shown in FIG. 6, the OLED display panel of the present embodiment comprises: a first substrate 11' having a first edge 11a', a second edge 11b', a third edge 11c' opposite to the first edge 11a', and a fourth edge 11d' opposite to the second edge 11b'; a second substrate 12' opposite to the first substrate 11' and having a ninth edge 12a', a tenth edge 12b', an eleventh edge 12c' opposite to the ninth edge 12a' and a twelfth edge 12d' opposite to the tenth edge 12b'; an OLED unit 121 disposed on the second substrate 12'; a frit unit 111 disposed between the first substrate 11' and the second substrate 12' and surrounding the OLED unit 121; and a buffer unit 112' disposed between the first substrate 11' and the second substrate 12' and between the frit unit 111 facing to the first edge 11a' of the first substrate 11' and the first edge 11a' thereof, wherein the buffer unit 112' has a first end 112a with a first cutting edge connecting to the second edge 11b' and the tenth edge 12b', and a second end 112b opposite to the first end 112a and with a second cutting edge connecting to the fourth edge 11d' and the twelfth edge 12d'. Herein, both the first end 112a and the second end 112b of the buffer unit 112' are formed in a curved shape with a concave surface facing to the OLED unit 121.

In addition, the OLED display panel of the present embodiment further comprises: a terminal unit 122 and a lead region 123 disposed on the second substrate 12'. The terminal unit 122 corresponds to the first edge 11a' of the first substrate 11'; and the buffer unit 112' is disposed on the lead region 123 connecting the OLED unit 121 and the terminal unit 122.

In the OLED display panel of the present embodiment, a width of the buffer unit 112' is in a range from 600 μm to 1200 μm, and that of the frit unit 111 is in a range from 500 μm to 1000 μm. In addition, a distance D1 between the buffer edge of the buffer unit 112' and the fit edge of the fit unit 111 facing to the buffer edge is in a range from 50 μm to 800 μm, and preferably in a range from 100 μm to 300 μm. Furthermore, distances D2', D3', D4' between the fit edge of the frit unit 111 and the second edge 12b', the third edge 12c' and the fourth edge 12d' of the second substrate 12' is in a range from 150 μm to 750 μm, and preferably in a range from 250 μm to 500 μm; and thus the purpose of narrowing the border region of the OLED display panel can be achieved.

In other embodiment of the present invention, as shown in FIG. 3 and FIG. 5, on the basis of the OLED unit 121, the first mother substrate 11 and the second mother substrate 12 may be selectively cut at sides of the OLED unit 121 facing to the sixth edge 12b, the seventh edge 12c and the eighth edge 12d and between the buffer unit 112 and the fit unit 111. More specifically, when the cutting process is performed to cut the first mother substrate 11 and the second mother substrate 12 at the least one sides facing to the sixth edge 12b, the seventh edge 12c and the eighth edge 12d between the buffer unit 112 and the frit unit 111, the first mother substrate 11 and the second mother substrate 12 are cut at the remaining sides opposite to the side of the buffer unit 112 adjacent to the frit unit 111. In this case, in the obtained OLED display panels, the buffer unit 112 is not only locates between the frit unit 111 and the first edge 11 a' of the first substrate 11, but also selectively locates between the frit unit 111 and the second edge 11b, the third edge 11c' and/or the fourth edge 11d' thereof. In other word, the buffer unit 112 may be formed in a "=" shape, an "L" shape or a "U" shape.

In the aforementioned embodiments, the first mother substrate with the buffer unit and the frit unit formed thereon in advance is assembled with the second mother substrate with the OLED unit formed thereon, followed by performing a cutting process. However, in other embodiment of the present invention, the buffer unit and the fit unit may be selectively formed on the second mother substrate. For example, one of the buffer unit and the fit unit is formed on the first mother substrate and the other is formed on the second mother substrate or both the buffer unit and the frit unit are formed on the second mother substrate, as long as each OLED unit is sequentially enclosed with the frit unit and the buffer unit after the first mother substrate and the second mother substrate are assembled.

Figure 7:
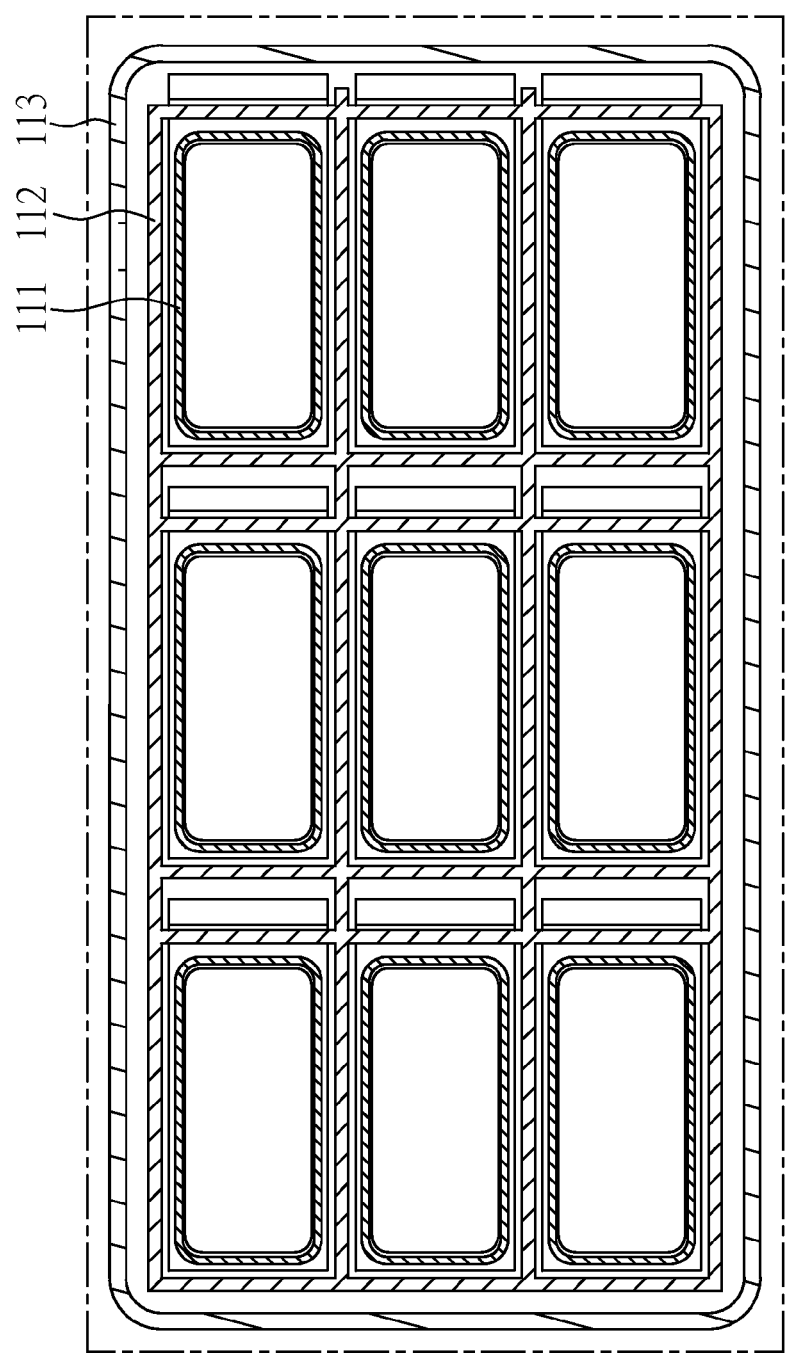
FIG. 7 is a perspective view showing a first mother substrate and a second mother substrate after an assembling process according to another preferred embodiment of the present invention.
Figure 8:
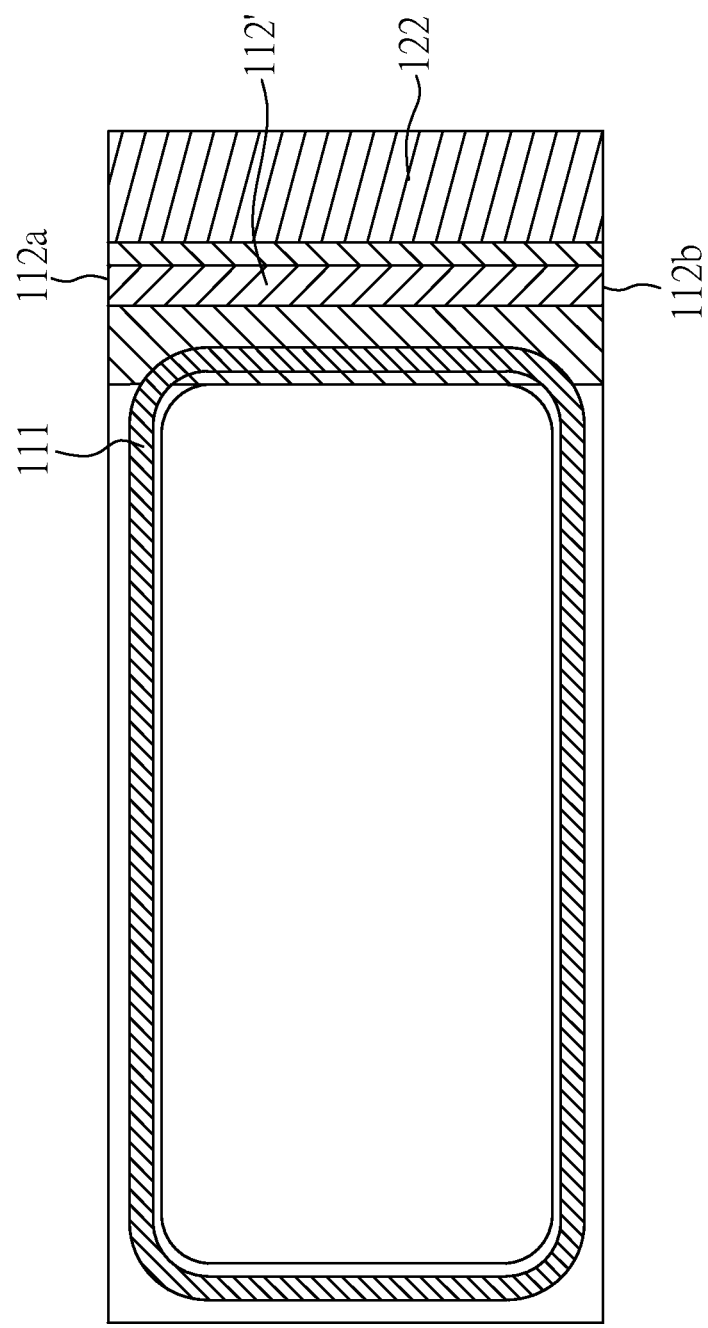
FIG. 8 is a perspective view of an OLED display panel according to another preferred embodiment of the present invention.

Furthermore, another embodiment of the present invention further provides an OLED display panel, which is manufactured through the same method illustrated above, except that the buffer unit 112 is formed in a linear manner through a continuous coating process to enclose the frit unit 111, as shown in FIG. 7. In addition, in the OLED display panel obtained in another embodiment of the present invention, the buffer unit 112' is formed in a straight line, and the first end 112a and the second end 112b thereof are not present in curve shapes.

Furthermore, the display panels provided by the aforementioned embodiments of the present invention can be applied to any electronic device for displaying images used in the art, such as a mobile phone, a notebook, a camera, a video camera, a music player, a navigation system, or a television.

Although the present invention has been explained in relation to its preferred embodiment, it is to be understood that many other possible modifications and variations can be made without departing from the spirit and scope of the invention as hereinafter claimed.

What is claimed is:

1. A method for manufacturing an OLED display panel, comprising the following steps:
providing a first mother substrate and a second mother substrate having a fifth edge, a sixth edge, a seventh edge opposite to the fifth edge and an eighth edge opposite to the sixth edge, wherein at least one OLED unit is disposed on the second mother substrate, at least one frit unit and at least one buffer unit are disposed between the first mother substrate and the second mother substrate, each of the frit unit respectively surrounds the OLED unit, and each of the buffer unit respectively surrounds the frit unit to obtain each of the OLED unit being sequentially enclosed with the frit unit and the buffer unit respectively;

cutting the first mother substrate and the second mother substrate at a side facing to the fifth edge of the second mother substrate and opposite to a side of the buffer unit near the frit unit, on the basis of the OLED unit; and respectively cutting the first mother substrate and the second mother substrate at sides facing to the sixth edge, the seventh edge and the eighth edge of the second substrate and between the buffer unit and the frit unit, on the basis of the OLED unit, to obtain the cutting buffer unit disposed between the frit unit facing to the fifth edge of the second mother substrate and the fifth edge thereof, and the cutting buffer unit has a first end with a first cutting edge connecting to the six edge of the second mother substrate and a second end with a second cutting edge connecting to the eighth edge of the second mother substrate, wherein the second end opposite to the first end.

2. The method as claimed in claim 1, wherein at least one terminal unit is disposed on the second substrate, which corresponds to a side of the OLED unit facing to the fifth edge of the second mother substrate.

3. The method as claimed in claim 1, wherein a distance between a buffer edge of the buffer unit and a frit edge of the frit unit facing to the buffer edge is in a range from 50 μm to 800 μm at a side corresponding to the fifth edge of the second mother substrate.

4. The method as claimed in claim 1, wherein distances between a buffer edge of the buffer unit and a frit edge of the frit unit facing to the buffer edge are respectively in a range from 300 μm to 1500 μm at side corresponding to the sixth edges, the seventh edge and the eighth edge of the second mother substrate.

* * * * *